US006627481B2

United States Patent
Lee et al.

(10) Patent No.: US 6,627,481 B2
(45) Date of Patent: Sep. 30, 2003

(54) METHOD OF MANUFACTURING A SEMICONDUCTOR PACKAGE WITH A LEAD FRAME HAVING A SUPPORT STRUCTURE

(75) Inventors: Meng-Tsang Lee, Kaoshiung (TW); Kuang-Lin Lo, Kaoshiung (TW)

(73) Assignee: Advanced Semiconductor Engineering Inc., Kaoshiung (TW)

( * ) Notice: Subject to any disclaimer, the term of this patent is extended or adjusted under 35 U.S.C. 154(b) by 0 days.

(21) Appl. No.: 10/056,358

(22) Filed: Jan. 25, 2002

(65) Prior Publication Data

US 2003/0092216 A1 May 15, 2003

(30) Foreign Application Priority Data

Nov. 9, 2001 (TW) ........................ 90127874 A

(51) Int. Cl.⁷ ................... H01L 21/44; H01L 21/48; H01L 21/50
(52) U.S. Cl. .................. 438/112; 438/123; 438/124
(58) Field of Search ................ 257/666, 672, 257/676, 782, 787; 438/123, 112, 124, 127

(56) References Cited

U.S. PATENT DOCUMENTS 5,389,739 A * 2/1995 Mills ........................ 174/52.4
5,578,871 A * 11/1996 Fierkens ..................... 257/676
6,303,985 B1 * 10/2001 Larson et al. ............... 257/669

FOREIGN PATENT DOCUMENTS

JP     405047979 A  *  2/1993
JP     410144853 A  *  5/1998

* cited by examiner

Primary Examiner—Wael Fahmy
Assistant Examiner—Hoai Pham
(74) Attorney, Agent, or Firm—Ladas & Parry

(57) ABSTRACT

The present invention relates to a method of manufacturing semiconductor packages and products thereof. The method of manufacturing comprises steps of: (a) providing a lead frame which comprises a die pad, a plurality of connecting parts and a plurality of leads, wherein the die pad is lower than the leads and connects the leads through the connecting parts, and wherein the die pad comprises at least one supporting structure to fix the lead frame substantially; (b) mounting a die onto the die pad and electrically connecting the lead frame and die by bonding wires; (c) providing an upper mold and a lower mold, wherein the upper mold and lower mold are located at an upper side and a lower side of the leads, respectively, wherein the supporting structures of the die pad are allowed to be supported on the lower mold, and the leads are allowed to protrude outwards from a mold cavity formed by the upper and lower molds; (d) setting the lead frame in steps (a) and (b) onto the lower mold in step (c) and making the supporting structures of the die pad to be supported on the lower mold and then combining the upper mold to the lower mold; (e) applying an encapsulant into the mold cavity formed by the upper and lower molds; and (f) removing the upper and lower molds after encapsulating.

2 Claims, 6 Drawing Sheets

METHOD OF MANUFACTURING A SEMICONDUCTOR PACKAGE WITH A LEAD FRAME HAVING A SUPPORT STRUCTURE

BACKGROUND OF THE INVENTION

1. Field of the Invention

The present invention relates to methods of manufacturing semiconductor packages, more particularly, to improved lead frames used in semiconductor packages.

2. Description of the Related Art

To meet the requirement of modern electric products being delicate, designs of semiconductor package are aiming at minimizing volume and thickness. However, such products tend to be multiple functions; thus sizes of semiconductor die to be packaged are enlarged. To make the semiconductor package have minimized volume and large dies is what persons skilled in this field expect.

Referring to FIGS. 1, 2, or 3, a conventional method of manufacturing semiconductor packages comprises steps of (a) providing a lead frame 11 which comprises a die pad 111, a plurality of connecting parts 112 and a plurality of leads 113, wherein the die pad 111 is lower than the leads 113, and the connecting parts 112 connect the die pad 111 and the leads 113; besides, the lead frame 11 made of copper retains appropriate flexibility; furthermore, inner fingers used in connecting circuits inside the package and/or outer fingers used in connecting circuits outside the package are etched in proper positions of the lead frame; (b) mounting a die 12 onto the die pad 111 and electrically connecting the lead frame 11 and die 12 by bonding wires 13; (c) providing an upper mold 14 and a lower mold 15, wherein the upper mold 14 and lower mold 15 are located at an upper side and a lower side of the leads 113, respectively; the lead frame 11, die 12, and bonding wires 13 are enclosed in a mold cavity formed by the upper and lower molds 14 and 15 thereby, and the leads 113 are allowed to protrude outwards from the mold cavity. After fabricating such a construction, it can be proceeded with (d) applying an encapsulant through a filling hole co-formed by the upper mold 14 and the lower mold 15; and (e) forming an encapsulant 16 after encapsulating and removing the upper and lower molds 14 and 15 to complete the package.

For the purpose of preventing the die pad 111 of the lead frame 11 from exposure out of the encapsulant 16, an appropriate distance between the die pad 111 and the lower mold 15 should be kept. Therefore, the thickness of the semiconductor package cannot be reduced. In addition, when the dies to be packaged are too thick to fit the mold size, such dies should be grinded and cost and process rise as well.

In addition, in the process of applying the encapsulant, the encapsulant will form an upper flow F1 and a lower mold flow F2, respectively, resulting from the separation of the lead frame 11 and the die 12.

Referring to FIG. 1, when the upper and lower mold flows F1 and F2 distribute evenly in the mold cavity formed by the upper mold 14 and lower mold 15, the lead frame 11, die 12 and bonding wires 13 are forced equally, and relative positions thereof with the upper mold 14 and lower mold 15 would not be changed substantially. In this situation, electric elements are successfully enclosed in the mold cavity to achieve the desired package.

However, referring to FIG. 2, in the process of applying the encapsulant, when the lower mold flow F2 is greater than the upper mold flow F1, a lifting force is applied to the flexible lead frame 11, and such a force may change angles of the connecting part 112 between the die pad 111 and leads 113. Extremely, the lifting force may even make the whole die pad 111 convex. The deformation of the lead frame 11 not only changes relative positions between elements but also may make the bonding wires 13 touch the upper mold 14. Thus, such a product becomes defect in view of the exposure of the bonding wires 13 outside the encapsulant 16.

On the other hand, if the upper mold flow F1 is greater than the lower mold flow F2 in the process of applying the encapsulant, as shown in FIG. 3, a pressing force is applied to the flexible lead frame 11, and such a force may also change angles of the connecting part 112 between the die pad 111 and leads 113. Extremely, the pressing force may even make the whole die pad 111 concave. The deformation of the lead frame 11 not only changes relative positions between elements but also may make the die pad 111 touch the lower mold 15. Thus, the exposure of the lead frame 11 outside the encapsulant 16 occurs as well. Furthermore, the bonding wires 13 may be broken because of the deformation of the lead frame 11, and such a product does not fit the requirement of packaging either.

The subject invention is to develop a novel method of manufacturing semiconductor packages to solve the problems of exposures of the bonding wires or lead frame and the semiconductor packages being over thick.

SUMMARY OF THE INVENTION

One objective of the present invention is to provide a method of manufacturing semiconductor packages and products thereof. The method of manufacturing comprises steps of: (a) providing a lead frame which comprises a die pad, a plurality of connecting parts and a plurality of leads, wherein the die pad is lower than the leads and connects the leads through the connecting parts, and wherein the die pad comprises at least one supporting structure to fix the lead frame substantially; (b) mounting a die onto the die pad and electrically connecting the lead frame and die by bonding wires; (c) providing an upper mold and a lower mold, wherein the upper mold and lower mold are located at an upper side and a lower side of the leads, respectively, wherein the supporting structures of the die pad are allowed to be supported on the lower mold, and the leads are allowed to protrude outwards from a mold cavity formed by the upper and lower molds; (d) setting the lead frame in steps (a) and (b) onto the lower mold in step (c) and making the supporting structures of the die pad to be supported on the lower mold and then combining the upper mold to the lower mold; (e) applying an encapsulant into the mold cavity formed by the upper and lower molds; and (f) removing the upper and lower molds after encapsulating.

Another objective of the present invention is to provide a lead frame used in a semiconductor package, which comprises a die pad, a plurality of connecting parts and a plurality of leads, wherein the die pad is lower than the leads and connects the leads through the connecting parts, and wherein the die pad comprises at least one supporting structure to fix the lead frame to the lower mold substantially. The present invention can enlarge ranges of the thickness of a die and avoiding the die from being grinded.

DETAILED DESCRIPTION OF THE INVENTION

The First Embodiment

Figure 1:
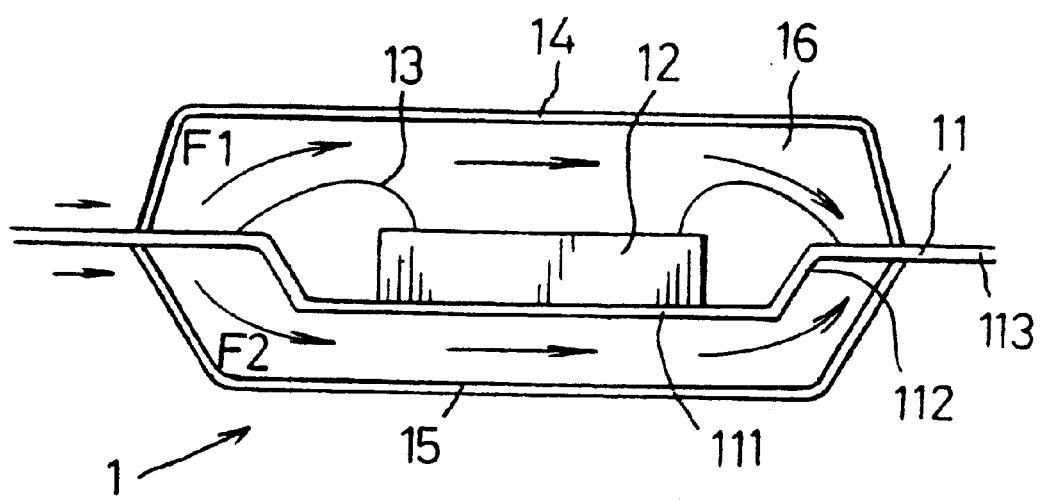
FIG. 1 is a cross-sectional view illustrating the first conventional mold flow in a method of manufacturing semiconductor packages.
Figure 2:
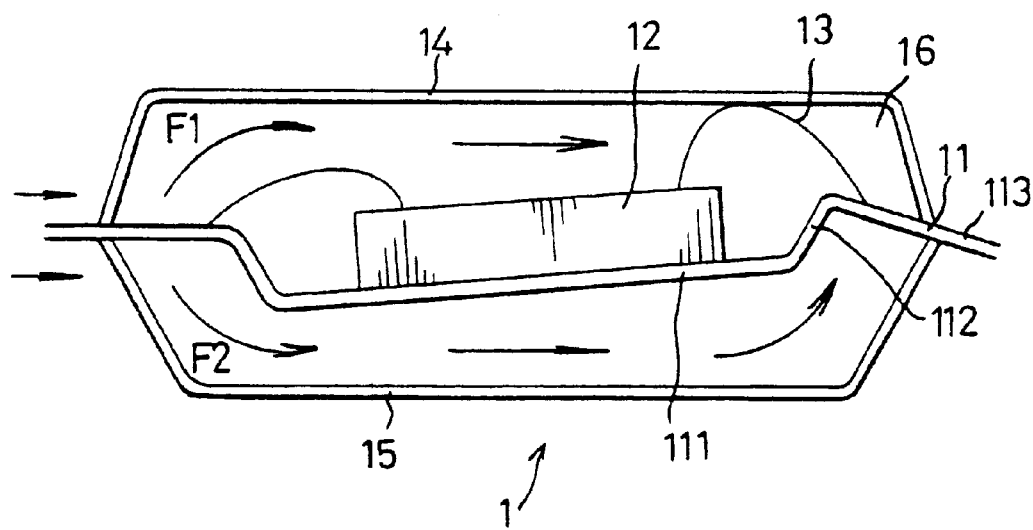
FIG. 2 is a cross-sectional view illustrating the second conventional mold flow in a method of manufacturing semiconductor packages.
Figure 3:
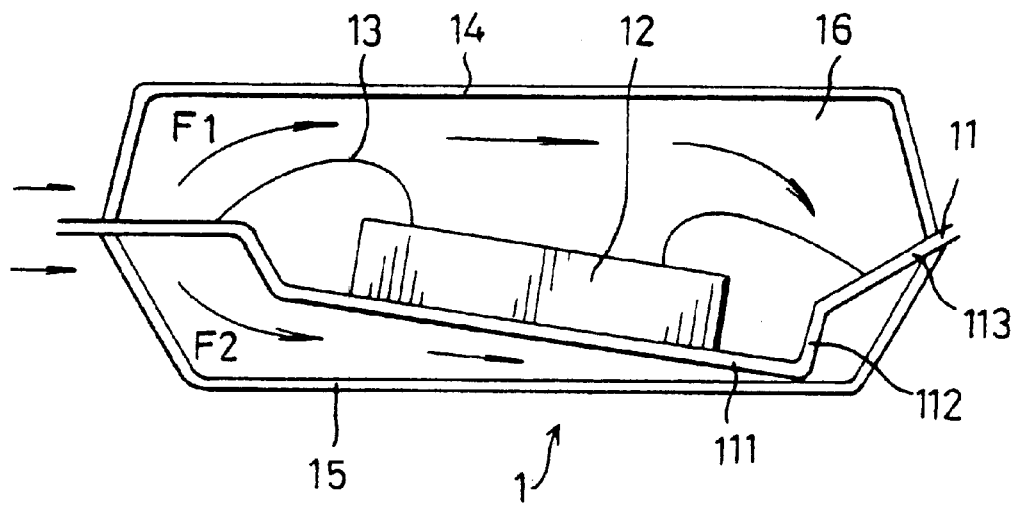
FIG. 3 is a cross-sectional view illustrating the third conventional mold flow in a method of manufacturing semiconductor packages.
Figure 4:
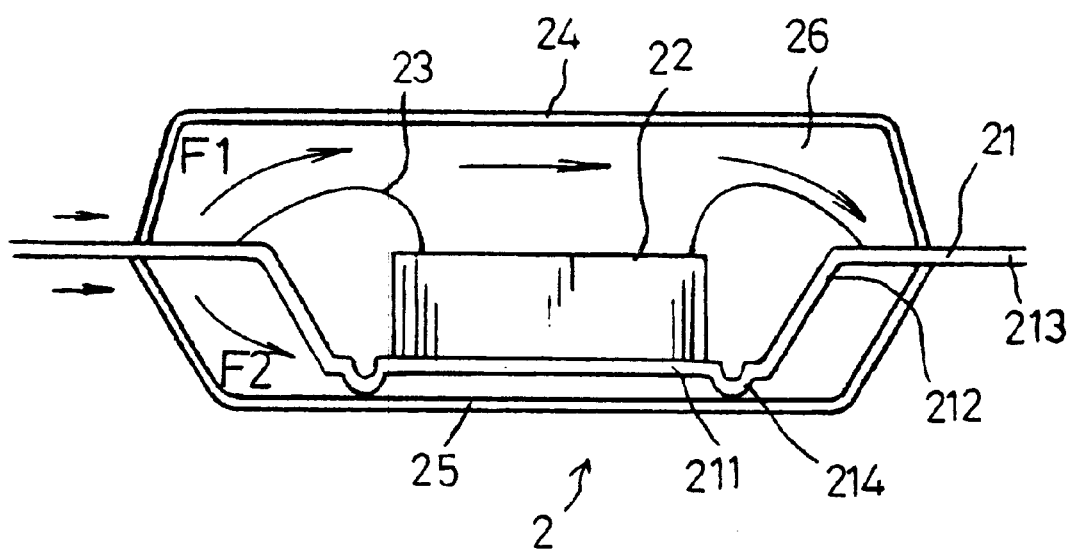
FIG. 4 is a cross-sectional view illustrating mold flows of a method of manufacturing semiconductor packages according to the first embodiment of the invention.
Figure 7:
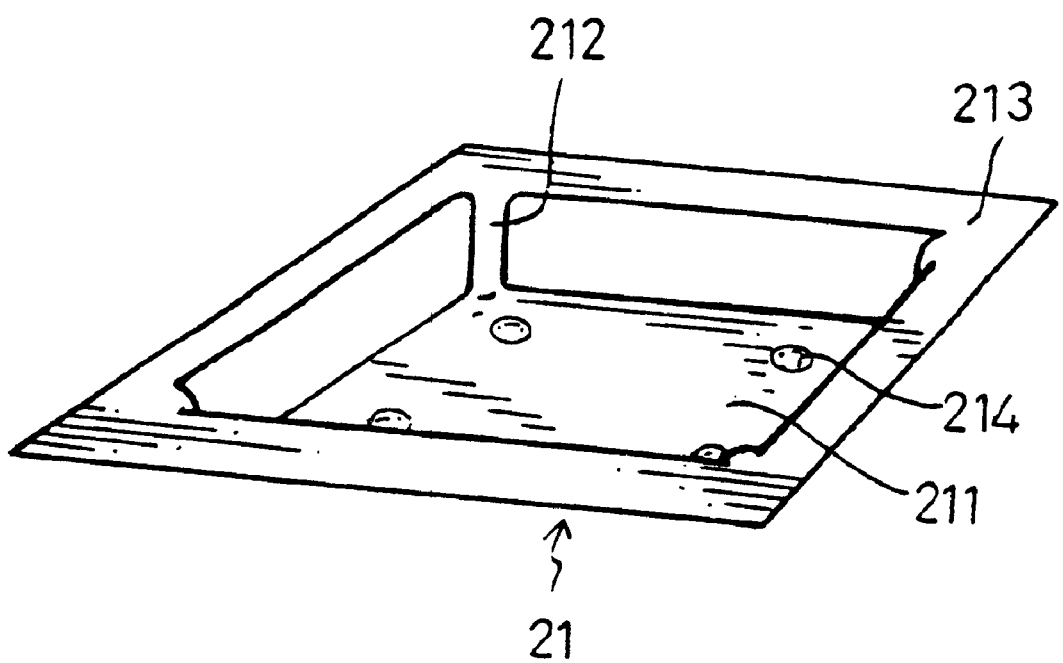
FIG. 7 is a perspective view illustrating a lead frame according to the invention.

Referring to FIGS. 4 and 7, a method of manufacturing semiconductor packages in the present invention comprises steps of: (a) providing a lead frame 21 which comprises a die pad 211, a plurality of connecting parts 212 and a plurality of leads 213; wherein the die pad 211 is lower than the leads 213 and connects the leads 213 through the connecting parts 212, and the die pad 213 comprises at least one supporting structure 214, and each of the supporting structure 214 is a protrusion protruding downwards from the die pad 211; (b) mounting a die 22 onto the die pad 211 and electrically connecting the lead frame 21 and die 22 by bonding wires 23; (c) providing an upper mold 24 and a lower mold 25, wherein the upper mold 24 and lower mold 25 are located at an upper side and a lower side of the leads 213, respectively, to enclose the lead frame 21, die 22, and bonding wires 23, and the leads 213 are allowed to protrude outwards from a mold cavity formed by the upper mold 24 and the lower mold 25; (d) mounting the lead frame 21 containing the die 22 and bonding wires 23 onto the lower mold 25 and making the supporting structures 214 of the die pad 211 to be supported on the lower mold 25 and then combining the upper mold 24 to the lower mold 25; (e) applying an encapsulant to the mold cavity co-formed by the upper mold 24 and the lower mold 25 through a filling hole (not shown); and (f) forming an encapsulant 26 and removing the upper mold 24 and lower mold 25 after encapsulating to complete the package.

The present invention is characterized in designs of the supporting structure 214. The lead frame 21 of the present invention is made of flexible conventional materials. In this embodiment, the supporting structures 214 are supported on the lower mold 25 as supporting points, and they make the whole lead frame 21 and the die 22 and bonding wires 23 thereon fix to the lower mold 25 substantially. A distance between the lead frame 21 and the lower mold 25 is reduced, and it further avoids keeping an appropriate distance of the lead frame and lower mold, which is for the purpose of preventing the exposure of the bonding wires and lead frame in the conventional packages. Therefore, when applying the encapsulant, most mold flows are an upper mold flow F1. A downward force applied by the upper mold flow F1 will not move or deform the lead frame 21, because of the fixation of the supporting structures 214 and thus it avoids the bonding wires and lead frame from exposing outside of the molds.

The Second Embodiment

Figure 5:
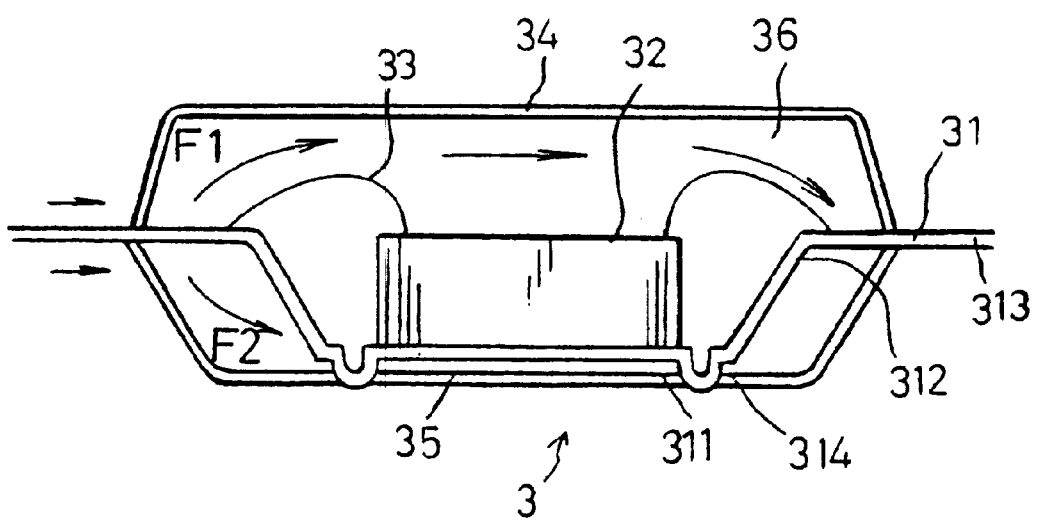
FIG. 5 is a cross-sectional view illustrating mold flows of a method of manufacturing semiconductor packages according to the second embodiment of the invention.

Referring to FIG. 5, the second embodiment is similar to the first embodiment in the invention, wherein a lead frame 31 comprises a die pad 311, a plurality of connecting parts 312 and a plurality of leads 313. The die pad 311 comprises at least one supporting structure 314. In this embodiment, the supporting structures 314 are a plurality of supporting points protruding downwards outside a lower mold 35 and then fixed thereon. The supporting points in the embodiment are designed to be set on the die pad 311 where are allowed to expose. As the result, such exposures are not exposures triggered by forces of the mold flow in any positions in conventional packages; therefore, the effects of the whole packages would not be affected.

The Third Embodiment

Figure 6:
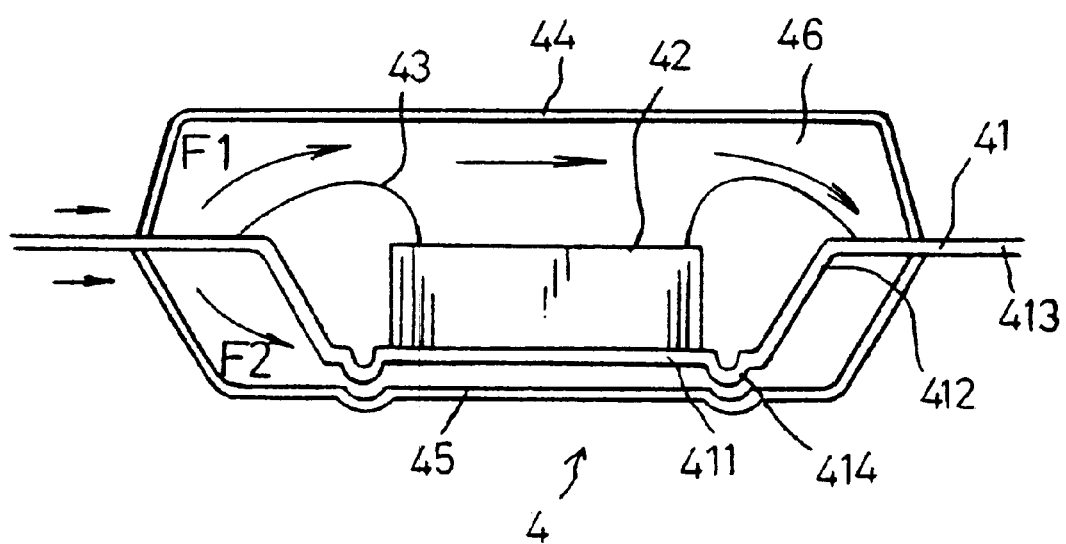
FIG. 6 is a cross-sectional view illustrating mold flows of a method of manufacturing semiconductor packages according to the third embodiment of the invention.

Referring to FIG. 6, the third embodiment is similar to the first embodiment in the invention, wherein a lead frame 41 comprises a die pad 411, a plurality of connecting parts 412 and a plurality of leads 413. The die pad 413 comprises at least one supporting structure 414. A lower mold 45 comprises a concave adapted to the supporting structure 414. For example, while each supporting structure 414 of the die pad 413 is a protrusion, positions on the lower mold 45 corresponding to the supporting structures 414 of the die pad 413 are identical protrusions as well. Such a design makes the fixation between the lead frame 41 and lower mold 45 stronger.

In the embodiments described above, the packages further comprise a first distance between the die pad and leads and a second distance between the leads and a base of the lower mold; wherein the first distance can be designed slightly larger than the second distance. During the fabrication, the die pad can take advantage of the supporting structures supported on the lower mold resulting from the flexible material to make the support stronger.

In the invention, designs of the supporting structures of the lead frame are not necessary to keep a distance between the lead frame and the lower mold to prevent from exposure. Therefore, as to the same sizes of the packages, the thickness of the die to be packaged in the invention can be enlarged to have superiority in competition. In addition, it avoids the thicker dies to be packaged from being grinded and prevents damages caused by grinding dies in the manufacturing conventional packages.

Shapes of the supporting structures in the methods of manufacturing semiconductor packages, products thereof, and lead frames in the present invention are not limited in what present in the above embodiments. The lead frame, which is supported on the lower mold to avoid movement or deformation in the process of applying an encapsulant, is in the scope of the invention. The lead frame of the invention can be further etched to form inner and outer fingers for electrical connection. The lead frame in the invention can be both applied to manufacturing single or a plurality of packages on one lead frame. While manufacturing a plurality of packages, they may connect each other by the leads to meet the requirement of production on a large scale.

While embodiments of the present invention have been illustrated and described, various modifications and improvements can be made by persons skilled in the art. The embodiments of the present invention are therefore described in an illustrative but not restrictive sense. It is intended that the present invention is not limited to the particular forms as illustrated, and that all the modifications not departing from the spirit and scope of the present invention are within the scope as defined in the appended claims.

What is claimed is:

1. A method according to claim 1, wherein the supporting structure protrudes downwards outside the lower mold.

2. A method according to claim 1, wherein the lower mold comprises a concave adapted to the supporting structure.

* * * * *

UNITED STATES PATENT AND TRADEMARK OFFICE
CERTIFICATE OF CORRECTION

| | | |
|---|---|---|
| PATENT NO. | : 6,627,481 B2 | |
| DATED | : September 30, 2003 | |
| INVENTOR(S) | : Meng-Tsang Lee et al. | |

It is certified that error appears in the above-identified patent and that said Letters Patent is hereby corrected as shown below:

Column 5,
Line 2, "according to claim 1" should read:
-- of manufacturing a semiconductor package, the method comprising the steps of:
    (a) providing a lead frame comprising a die pad, a plurality of connecting parts, a plurality of leads, and at least one supporting structure;
    (b) mounting a die onto the die pad and electrically connecting the lead frame and die by bonding wires;
    (c) providing an upper mold and a lower mold at an upper side and a lower side of the leads, respectively, wherein the leads protrude outwards from a mold cavity formed by the upper and lower molds and the supporting structure allows support of the die pad on the lower mold; and
    (d) encapsulating at least the die and bonding wires of the so supported die pad, -- and begin a new paragraph with "wherein".

Column 6,
Line 2, "according to claim 1" should read:
-- of manufacturing a semiconductor package, the method comprising the steps of:
    (a) providing a lead frame comprising a die pad, a plurality of connecting parts, a plurality of leads, and at least one supporting structure;
    (b) mounting a die onto the die pad and electrically connecting the lead frame and die by bonding wires;

UNITED STATES PATENT AND TRADEMARK OFFICE
CERTIFICATE OF CORRECTION

PATENT NO. : 6,627,481 B2
DATED : September 30, 2003
INVENTOR(S) : Meng-Tsang Lee et al.

It is certified that error appears in the above-identified patent and that said Letters Patent is hereby corrected as shown below:

Column 6 (cont'd),
    (c) providing an upper mold and a lower mold at an upper side and a lower side of the leads, respectively, wherein the leads protrude outwards from a mold cavity formed by the upper and lower molds and the supporting structure allows support of the die pad on the lower mold; and
    (d) encapsulating at least the die and bonding wires of the so supported die pad, -- and begin a new paragraph with "wherein".

Signed and Sealed this

Twenty-seventh Day of January, 2004

JON W. DUDAS
*Acting Director of the United States Patent and Trademark Office*